United States Patent [19]

Oura

[11] 4,023,122
[45] May 10, 1977

[54] SIGNAL GENERATING CIRCUIT

[75] Inventor: Toshio Oura, Tokyo, Japan

[73] Assignee: Nippon Electric Company, Ltd., Tokyo, Japan

[22] Filed: Jan. 23, 1976

[21] Appl. No.: 651,697

[30] Foreign Application Priority Data

Jan. 28, 1975 Japan .............................. 50-12164
Jan. 28, 1975 Japan .............................. 50-12165

[52] U.S. Cl. .............................. 331/111; 307/228; 307/251; 307/261
[51] Int. Cl.² .................... H03K 3/353; H03K 4/06
[58] Field of Search ............... 307/228, 235 R, 260, 307/263, 268, 251; 328/36, 181, 183–185; 331/111

[56] References Cited

UNITED STATES PATENTS 3,289,103  11/1966  Campman .......................... 331/111
3,904,988  9/1975  Hsiao ................................ 331/111

Primary Examiner—John Zazworsky
Attorney, Agent, or Firm—Hopgood, Calimafde, Kalil, Blaustein & Lieberman

[57] ABSTRACT

A signal generating circuit includes a switching circuit that includes two series-connected circuits. Each of the latter includes an enhancement-type MOS FET and a depletion-type MOS FET connected between one terminal of a power source and a junction point of the series-connected circuits. The junction point is used as the output terminal of the switching circuit.

5 Claims, 11 Drawing Figures

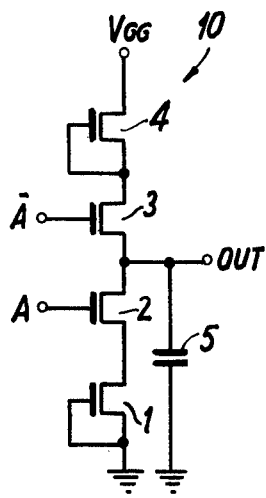 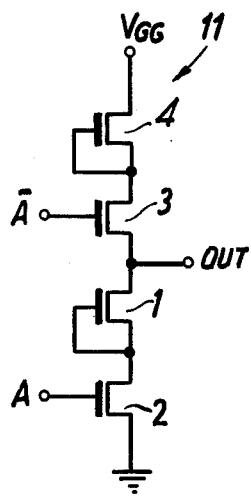 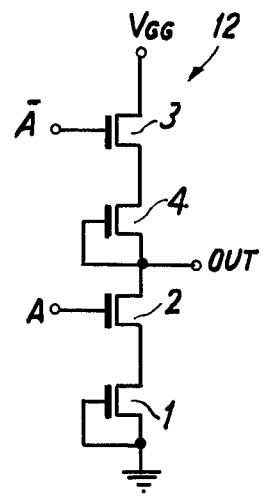 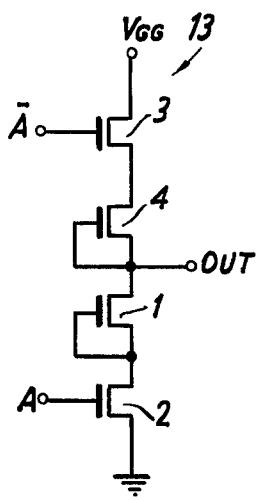
FIG. 1a  FIG. 1b  FIG. 1c  FIG. 1d
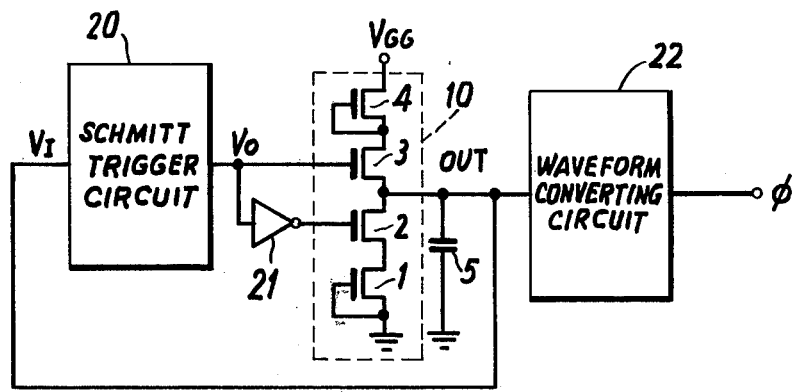
FIG. 2
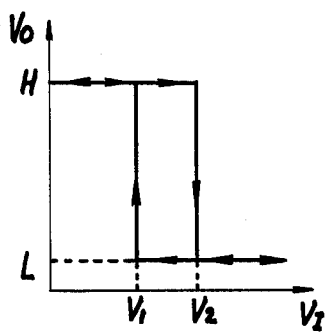
FIG. 3
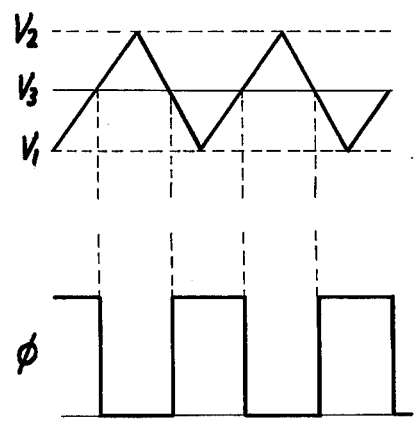
FIG. 4a
FIG. 4b

SIGNAL GENERATING CIRCUIT

The present invention relates generally to signal generating circuits using insulated-gate field effect transistors, and more particularly to a clock pulse generating circuit including a switching circuit having depletion-type MOS FET's.

MOS FET's are classified as either enhancement-type transistors or depletion-type transistors. In the depletion-type transistor, a conductive pass, viz, a channel, is present between a source and a drain under a zero gate-bias condition; in the enhancement-type transistor, a channel is not formed under a zero gate-bias condition.

An increasing number of E-D MOS logic circuits are being utilized, which employ an enhancement-type MOS FET as a switching element and a depletion-type MOS FET as the load element. This type of logic circuit is driven by clock pulses of a given frequency, and which are generated by a circuit constituted of an E-E MOS switching circuit using enhancement-type MOS FET's as both load and switching elements. The clock pulses of the desired frequency are obtained by charging and discharging a capacitor under the control of the E-E MOS switching circuit. It is known that the frequency $f_1$ of the pulses generated by the prior art circuit using the E—E MOS switching circuit is inversely proportional to the threshold voltage $V_{TE}$ of the enhancement-type MOS FET and directly proportional to the potential source $V_{GG}$ applied to the gate thereof. The frequency $f_{ED}$ at which the E-D MOS logic circuit can operate depends solely on the current $I_{TD}$ which is dependent on the threshold voltage $V_{TD}$ of the load MOS FET, i.e., the depletion-type MOS FET. In other words, the frequency $f_{ED}$ is proportional to the current $I_{TD}$, and is totally independent of the threshold voltage $V_{TE}$ and the potential source $V_{GG}$.

Generally, the frequency $f_{ED}$ must be higher than the frequency $f_1$ of the clock pulses used to drive the E-D MOS logic circuit, irrespecitve of variations in power source voltage fluctuation, threshold voltage $V_{TE}$, and temperature. To this effect, the frequency at which the logic circuit operates should be as high as possible. Accordingly, the current which flows in the load MOS FET of the E-D MOS logic circuit should be as large as possible, which results in an undesirably high power consumption in the circuit.

It is an object of the invention to provide a signal generating circuit that is well suited for E-D MOS logic circuits.

It is another object of the present invention to provide a clock pulse generating circuit in which the power consumption is reduced as compared to conventional generating circuits.

It is a further object of the invention to provide a signal generating circuit in which the signal frequency is independent of variations in threshold voltage levels, power source voltages, and temperatures.

It is still another object of the invention to provide a signal generating circuit of the type described which may be implemented in a reduced-size integrated circuit.

A switching circuit used for the purpose of the present invention comprises two series-connected circuits of which comprises an enhancement-type MOS FET and a depletion-type MOS FET. The enhancement- and depletion-type MOS FET's of each of the series-connected circuits are serially connected between one of two terminals of a power source and a junction point of the series-connected circuits. The gate and source of the depletion-type MOS FET of each circuit are connected in common, and the junction point is used as the output terminal of the switching circuit. In this switchng circuit, the switching time is proportional only to the current $I_{TD}$ which depends on the threshold voltage $V_{TD}$ of the depletion-type MOS FET. Furthermore, since signals opposite in polarity to each other are applied to the gates of the switching MOS FET's, i.e., the enhancement-type MOS FET's, there is no direct-current pass in this switching circuit. Accordingly, by the use of the switching circuit composed E-D MOS FET's, a signal generating circuit is obtained, which is suitable for driving the E-D MOS logic circuit.

The signal generating circuit according to the present invention comprises the two series-connected circuits as mentioned above, means for generating a first signal in response to an input signal above a first voltage level at the rise of the input signal, and a second signal in response to an input signal below a second voltage level at the fall of the input signal, an inverter circuit for inverting the output of the signal generating means, and a capacitor connected to the junction point of the two series-connected circuits. The output of the signal generating means and the output of the inverter circuit are applied respectively to the gates of the enhancement-type MOS FET's of the series-connected circuits, and the input of the signal generating means is connected to the junction point. The signal generating circuit preferably comprises a converting means for converting the output signal of the switching circuit into clock pulses.

In the signal generating circuit of the invention, the time taken to charge or discharge the capacitor having a given capacitance depends solely on the constant current $I_{TD}$ which is dependent on the threshold voltage of the depletion-type MOS FET. Hence the clock frequency $f_2$ generated thereby depends on the capacitance of the capacitor and the constant current $I_{TD}$. The frequency $f_{ED}$ at which the E-D MOS logic circuit operates depends on the constant current $I_{TD}$ of the load MOS FET. Accordingly, by determining the frequency $f_1$ to be lower than the frequency $f_{ED}$ under a predetermined capacitance of the capacitor, the relationship between the two frequencies $f_1$ and $f_{ED}$ does not always change irrespective of power source voltage fluctuation or variations in the threshold voltage $V_{TE}$. This enhances freedom in setting the value of $I_{TD}$, with the result that the need for a greater $I_{TD}$, as in the prior art circuit, is eliminated and the power consumed is reduced. The invention therefore makes it possible to integrate a MOS logic circuit into a reduced size on the chip.

The other object, features and advantages of the invention will become more apparent from the following description when read in conjunction with the accompanying drawings, wherein:

FIGS. 1a to 1d are schematic diagrams of several switching circuits used in the signal generating circuit of the invention; FIG. 2 is a schematic diagram of a signal generating circuit according to an embodiment of the invention using the switching circuit of FIG. 1a.

FIG. 3 shows the input-output characterisitcs of a Schmitt trigger circuit,

FIGS. 4a and 4b show waveforms for illustrating the operation of the signal generating circuit shown in FIG. 2.

Figure 5:
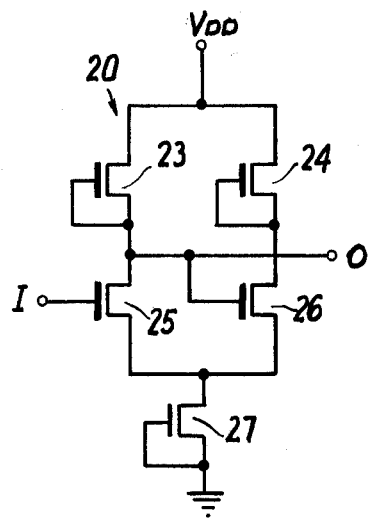
Figure 6:
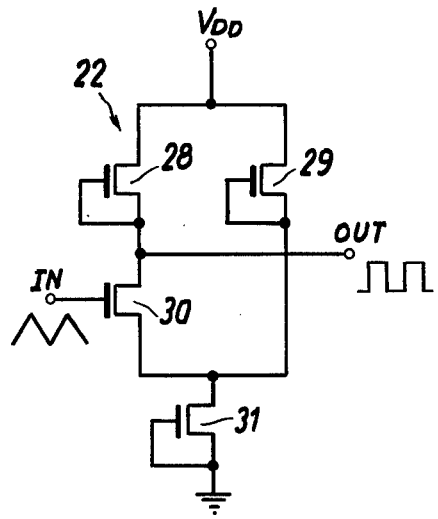
Figure 7:
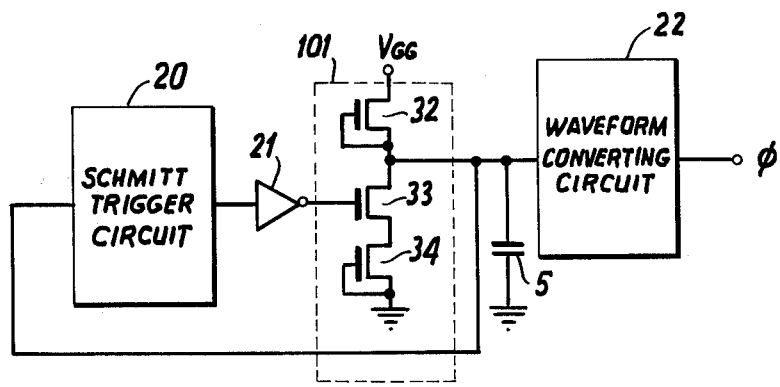

FIG. 5 schematically shows an example of a Schmitt trigger circuit,

FIG. 6 schematically shows an example of a circuit for converting a waveform, and FIG. 7 is a schematic diagram of a signal generating circuit according to another embodiment of the invention.

For the sake of explanatory simplicity, the transistors used in the switching and other circuits herein described are assumed to be n-channel MOS FET's. It will be appreciated that p-channel MOS FET's or other insulated-gate type field effect transistors may be used in place of the n-channel MOS FET's.

With reference to FIG. 1a, there is shown a switching circuit 10 used for the purpose of the invention, wherein a depletion-type transistor 1 has its gate electrode connected to its source electrode and to ground. An enhancement-type transistor 2 has its source electrode connected to the drain electrode of the transistor 1, and its drain electrode is connected to the source of electrode of an enhancement-type transistor 3 and to an output terminal OUT. The transistor 3 has its drain electrode connected to the source and gate electrodes of a depletion-type transistor 4. The drain electrode of the transistor 4 is connected to a power supply $V_{GG}$. Input signals A and $\overline{A}$ of inverted polarities with respect to each other are applied to the gate electrodes of the transistors 2 and 23, respectively. The resistances of the enhancement-type transistors 2 and 3 are much less than, and can be considered negligible as compared to those of the depletion-type transistors 1 and 4. Thus, the current flowing through the transistors 1 and 2 is represented by a substantially constant current which can flow through the depletion-type transistor 1, i.e., the current dependent on the threshold voltage $V_{TD}$ of the depletion-type transistor. Similarly, a current flowing through the transistors 3 and 4 is represented by the constant current which can flow through the depletion-type transistor 4. The switching time of circuit 10 is inversely proportional to the current used to drive an output capacitor 5 which is connected to the output terminal OUT. If it is assumed that the transistor 3 is on and the transistor 2 is off when the input A is at a high lever (hereinafter briefly, L level) and the input $\overline{A}$ is at a high level (hereinafter briefly, H level), the switching time from the L to H level at the output terminal OUT is inversely proportional to the current, in turn, which depends on the threshold voltage $V_{TD}$. The transistor 3 is off and the transistor 2 is on when the input A is at the H level and the input $\overline{A}$ is at the L level, where the switching time from the H to L level at the output terminal OUT is inversely proportional to the current which, in turns depends on the threshold voltage $T_{TD}$.

Transistors 1 and 2 in the switching circuit 10 on FIG. a may be connected reversely to each another between the output terminal and ground, as shown in the switching circuit 11 of FIG. 1b. Also, transistors 3 and 4 in the switching circuit of FIG. 1a may be connected upside down between the power source terminal and the output terminal, as shown in the switching circuit 12 of FIG. 1c. Moreover, transistors 1 and 2 in the circuit 12 of FIG. 1c may be connected upside down, as shown in the switching circuit 13 of FIG. 1d.

It will be appreciated that the switching circuits 11, 12 and 13 shown in FIGS. 1b to 1d are functionally the same as the switching circuit 10 shown in FIG. 1a.

Referring to FIG. 2, there is shown a clock pulse generating circuit for driving an E-D MOS logic circuit in which any one of the foregoing switching circuits may be used. In this example, the switching circuit 10 of FIG. 1a is employed. In FIG. 2, the output of a Schmitt trigger circuit 20 having a hysteresis input-output characterisitc is applied directly to the gate of the transistor 3, and to the gate of the transistor 2 through an inverter 21. A capacitor 5 is connected between the output terminal OUT of the switching 10 and ground. The output terminal OUT is connected to the input terminal of the Schmitt trigger circuit 20 and also to the input terminal of a waveform converting circuit 22 which generates a series of clock pulses o at its output.

FIG. 3 shows the input and output characteristics of the Schmitt trigger circuit 20. This circuit has two threshold voltages for the input signal: $V_1$ at the fall, and $V_2$ at the rise of the input signal. Thus, the Schmitt trigger circuit 20 generates an output of H level for a voltage below $V_1$ at the fall of the input signal, or an output of L level for a voltage above $V_2$ at the rise of the input signal. The circuit of FIG. 2 operates in the following manner. When the output of the Schmitt Trigger circuit 20 is at the L level, the output of the inverter 21 is at the H level to cause the transistor 2 to turn on and the transistor 3 to turn off. As a result, the charge held across the capacitor 5 is released by the substantially constant current $I_{TD}$ which is limited by the transistor 1, i.e., the current which depends on the threshold voltage $V_{TD}$ of the depletion-type MOS transistor. This makes the potential at the output terminal OUT ready to charge from the H level to the L level (ground level). Therefore, the time taken to discharge the capacitor is inversely proportional to the current ITD, which depends on the threshold voltage $V_{TD}$.

When the output at the output terminal OUT reaches the level of $V_1$ (FIG. 3), the output of the Schmitt trigger circuit 20 is inverted to the H level, causing the transistor 3 to turn on, and the transistor 2 to turn off. Accordingly, the capacitor 5 is charged by the constant current $I_{TD}$ limited by the transistor 4, i.e., the current which depends on the threshold voltage $V_{TD}$ of the depletion-type transistor 4. The charging time is inversely proportional to the constant current $I_{TD}$. When the potential across the capacitor 5 reaches the level of $V_2$ (FIG. 3), the output of the Schmitt trigger circuit 20 returns to the L level, causing the transistor 3 to turn off, and the transistor 2 to turn on. As a result the capacitor 5 is discharged again through the transistors 1 and 2. Repeating a series of these operations maintains the oscillation of the circuit.

FIG. 4 (a) shows a triangular waveform at the output terminal OUT, which is converted into a clock pulse $\phi$ (FIG. 4(b)) by the waveform converting circuit 22 in such manner that the threshold voltage $V_3$ of the circuit 22 is determined to be intermediate the threshold voltages $V_1$ and $V_2$ of the Schmitt trigger circuit 20.

The Schmitt trigger circuit 20 of FIG. 2 may be constituted of a known circuit, an example of which is shown in FIG. 5, which, as shown, comprises depletion-type transistors 23 and 24 each having a source and a gate connected in common and a drain connected to a power source $V_{DD}$. The source of the depletion-type transistor 23 is connected to the drain of an enhancement-type transistor 25, and the junction point of the source and the drain serves as the output terminal O of the Schmitt trigger circuit. The gate of the transistor 25 is an input terminal I, and the source thereof is connected to the source of an enhancement-type transistor 26 and to the drain of a depletion-tupe transistor 27. The gate and source of the transistor 27 are grounded. The source of the transistor 24 is connected to the drain of the transistor 26, and the gate of the transistor 26 is led to the output terminal O. The input-output characteristics of the circuit of FIG. 5 can be determined as in FIG. 3 by setting the transconductance $g_m$ of the transistor 23 to be lower than that of the transistors 24 and 27.

The waveform-converting circuit 22 of FIG. 2 may be constituted of any circuit capable of converting a triangular waveform into a pulse of square waveform, an example of which is shown in FIG. 6. In this circuit, each of depletion-type transistors 28 and 29 has a gate and a source connected in common, and a drain connected to a power source $V_{DD}$. The source of the transistor 28 is connected to the drain of an enhancement-type transistor 30 and to the output terminal OUT. The gate of the transistor 30 serves as the input terminal IN, and the source of the transistor 29 is connected to the drain of a depletion-type transistor 31. The transistor 31 has its gate and source grounded, and its drain is connected to the source of the transistor 30. The transconductance $g_m$ of the transistor 28 is made sufficiently lower than those of the transistors 29 and 31, whereby the current flowing through the transistor 28 does not affect the current flowing through the transistor 31 even if the transistor 30 turns on depending on the input condition. Accordingly, the drain voltage of the transistor 31 is always a voltage $V_{SD}$ between the source and drain voltage of the transistor 31, and hence the threshold voltage $V_3$ of the circuit is given as: $V_3 \approx V_{SD} + V_{TE}$ (where $V_{TE}$ is the threshold voltage of transistor 30). Thus, by determining the threshold voltage $V_3$ to be intermediate the threshold voltages $V_1$ and $V_2$ of the Schmitt trigger circuit 20, clock pulse $\phi$ of FIG. 4b are made available at the output terminal OUT, when the input signal in FIG. 4a is applied to the input terminal IN.

FIG. 7 shows another example of a clock pulse generating circuit suited for the E-D MOS logic circuit. This example is the same as that shown in FIG. 2, except for the switching circuit by which the capacitor 5 is charged and discharged. In FIG. 7, the switching circuit 101 comprises a depletion-type transistor 32 having its gate and source connected together, and its drain connected to a power source $V_{GG}$. An enhancement-type transistor 33 has its drain connected to the output terminal OUT and to the source of the transistor 32. The source of the transistor 33 is connected to the drain of a depletion-type transistor 34, and its gate is connected to the output terminal of an inverter 21. The gate and source of the transistor 34 are grounded. When the potential at the gate of the transistor 33 stands at the H level, the transistor 33 is conductive, and the potential at the output terminal OUT is released toward a potential which depends on the resistance ratio among those of the transistor 32 and transistors 33, 34. Because switching circuit 101 is of ratio circuit, a DC current flows through the transistors 32, 33 and 34, resulting in the consumption of a greater amount of power than in the generating circuit of FIG. 2. However, switching circuit 101 is advantageous over that of FIG. 2 in that the former circuit requires a relatively small area on an integrated circuit chip because of the elimination of one enhancement-type transistor. The charging and discharging periods of time are inversely proportional to a constant current which can flow through the depletion-type transistors 32 and 34, i.e., the current $I_{TD}$ which depends on the threshold voltage $V_{TD}$ of the depletion-type transistor. Accordingly, the frequency of the clock pulse $\phi$ is proportional to the current $I_{TD}$.

If in the circuit of FIG. 2, the transistor 2 and the inverter 21 were obviated and the drain of the transistor 2 connected to the terminal OUT, the clock pulses $\phi$ shown in FIG. 4b could be obtained.

As described above, the period of the clock pulses is the sum of the periods needed to charge and discharge the capacitor; hence, the frequency of the clock pulses is proportional to the current $I_{TD}$ which depends on the threshold voltage $V_{TD}$ of the depletion-type MOS FET. The frequency of the clock pulses is virtually free of the threshold voltage $V_{TE}$ of the enhancement-type MOS FET and the fluctuation of power source voltage. Therefore, when an E–D MOS logic circuit is driven by the clock pulses generated from the circuit of the invention, the switching speed of the E–D MOS logic circuit and the frequency of the clock pulses are determined only by the current $I_{TD}$ which depends on the threshold voltage $V_{TD}$ of the depletion-type MOS FET, and hence the operating frequency of the E–D MOS logic circuit is made slightly higher than the frequency of the clock pulses of the generating circuit, whereby power consumption is reduced significantly which makes possible the realizaton of an E–D MOS logic circuit that is operable with a minimum of power dissipation.

What is claimed is:

1. A signal generating circuit comprising:
   means for generating a signal having first and second levels in response, respectively, to a portion of an input signal above a first voltage level at the rise of said input signal and to a portion of said input signal below a second voltage level at the fall of said input signal;
   means connected to said signal generating means for inverting the output of said signal generating means;
   a switching circuit including first and second circuits, each of which includes an enhancement-type insulated-field effect transistor and a depletion-type insulated-gate field effect transistor, said first and second circuits being serially connected between the first and second terminals of a power source and connected to each other at a junction point, the output of said signal generating mean and the output of said inverter means being applied respectively to the gates of said enhancement-type transistors of said first and second circuits;
   a capacitor connected to said junction point of said first and second circuits; and means connected the input of said signal generating means to said junction point.

2. A signal generating circuit as in claim 1 further comprising means for converting the signal at said junction point into a clock pulse.

3. A signal generating circuit comprising:
   means for generating a signal having first and second levels in response, respectively, to a portion of an input signal above a first voltage level at the rise of said input signal and to a portion of said input signal below a second voltage level at the fall of said input signal;

a switching connected to said signal generating means, said switching circuit comprising a circuit having an enhancement-type insulated-type field effect transistor with its gate operatively connected to the output of said signal generating means, and a first depletion-type insulated-gate field effect transistor with its gate and source connected in common, said enhancement-type transistor and said first depletion-type transistor being connected in series between a first terminal of a power source and a junction point;

a second depletion-type insulated-type field effect transistor with its gate and source connected together, said second depletion-type transistor being connected between a second terminal of the power source and said junction point;

a capacitor connected to said junction point; and means connecting the input of said signal generating means to said junction point.

4. The signal generating circuit as in claim 3, further comprising means connected to said switching circuit for converting the signal at said junction point into clock pulses.

5. The signal generating circuit of claim 1, in which the gate and source of said depletion-type transistor in said first circuit are connected to one another, and the gate and source of said depletion-type transistor in said second circuit are connected to one another.

* * * * *

UNITED STATES PATENT OFFICE
CERTIFICATE OF CORRECTION

Patent No. 4,023,122          Dated May 10, 1977

Inventor(s) Toshio Oura

It is certified that error appears in the above-identified patent and that said Letters Patent are hereby corrected as shown below:

Claim 1, line 48, change "insulated-field" to

-- insulated-gate field --;

line 53, change "mean" to -- means --;

line 58, change "connected" to -- connecting --;

Claim 3, line 5, change "insulated-type" to

-- insulated-gate --;

line 14, change "insulated-type" to -- insulated-gate --;

Signed and Sealed this nineteenth Day of July 1977

[SEAL]

Attest:

RUTH C. MASON
*Attesting Officer*

C. MARSHALL DANN
*Commissioner of Patents and Trademarks*